US006687628B2

(12) United States Patent
Jaffe

(10) Patent No.: US 6,687,628 B2
(45) Date of Patent: Feb. 3, 2004

(54) ENHANCED SIGNAL ANALYSIS IN AN AMPLITUDE VERSUS FREQUENCY FORMAT

(75) Inventor: Stanley Edward Jaffe, Santa Rosa, CA (US)

(73) Assignee: Agilent Technologies, Inc., Palo Alto, CA (US)

(*) Notice: Subject to any disclaimer, the term of this patent is extended or adjusted under 35 U.S.C. 154(b) by 293 days.

(21) Appl. No.: 09/752,077

(22) Filed: Dec. 29, 2000

(65) Prior Publication Data

US 2002/0120414 A1 Aug. 29, 2002

(51) Int. Cl.[7] .................................. G09G 5/00
(52) U.S. Cl. .................. 702/67; 702/182; 702/183; 702/76; 702/147
(58) Field of Search ............... 702/182, 183, 702/76, 147, 67; 73/659, 660, 579, 583, 593, 609, 559; 340/681–683; 324/207, 25, 226; 708/400

(56) References Cited

U.S. PATENT DOCUMENTS 5,103,402 A * 4/1992 Morton et al. ............ 702/76
6,108,609 A * 8/2000 Qian et al. ............... 702/66
6,332,116 B1 * 12/2001 Qian et al. ............... 702/183
2001/0035879 A1 * 11/2001 Washington et al. ....... 345/763
2001/0036304 A1 * 11/2001 Yang et al. ............... 382/132
2002/0052721 A1 * 5/2002 Ruff et al. ............... 703/1
2002/0080149 A1 * 6/2002 Alexander et al. ......... 345/634
2002/0183948 A1 * 12/2002 Qian et al. ............... 702/75

OTHER PUBLICATIONS

"User's Quick Start Guide" for Infiniium Oscilloscopes, available from Agilent Technologies as Publication No. 54810–97045, Jan. 2000, p. 3–14.

* cited by examiner

Primary Examiner—Marc S. Hoff
Assistant Examiner—Carol S Tsai

(57) ABSTRACT

A signal analyzer has a display with two regions. In a first region there is displayed a first waveform representing a signal. The first waveform is shown in two dimensions. One dimension represents signal amplitude and one dimension represents signal frequency. In a second region is displayed a second waveform. The second waveform represents a subset of data points of the first waveform. The second waveform also is shown in two dimensions. One dimension represents signal amplitude and one dimension represents signal frequency.

7 Claims, 3 Drawing Sheets

ENHANCED SIGNAL ANALYSIS IN AN AMPLITUDE VERSUS FREQUENCY FORMAT

BACKGROUND

The present invention concerns signal analysis and pertains particularly to enhanced signal analysis in an amplitude versus frequency format.

A spectrum analyzer is a tunable frequency instrument that displays a portion of the frequency spectrum with amplitude of signals on the vertical axis and frequency on the horizontal axis on a screen. Spectrum analyzers can be useful when monitoring various types of transmission systems. Spectrum analyzers are typically used for analyzing optical or radio frequency transmissions. For example, wavelength division multiplexing (WDM) fiber optic transmission systems use between 4 and 500 laser signals to transmit information. Each laser signal resides within a specific frequency channel. The channel is defined by its center frequency, bandwidth, minimum and maximum signal power. A spectrum analyzer can be used to monitor the performance of each laser signal within the many channels of a WDM system.

When measuring a signal using a spectrum analyzer, the signal is displayed in the amplitude versus frequency format. The general technique used begins with a wide span, allowing the user to observe a number of signals (if present). To "zoom in" on a desired signal, the user can use either the frequency center and span functions, or marker-to-center and span controls. The process is reversed and repeated to analyze other signals of interest. The disadvantage of this technique is the repeated switching back and forth between wide and narrow spans and the inability to observe both views simultaneously.

In an oscilloscope waveforms are displayed with amplitude of signals on the vertical axis and time on the horizontal axis. Some oscilloscopes utilize a delayed sweep function. Typically, activating a delayed sweep function results in the waveform area being split into two regions. One region is the main sweep. A second region is a delayed sweep, which represents an expansion of the acquired waveform data. A section of the waveform in the main sweep window is highlighted to indicate the part displayed in the delayed sweep window. For example, in Infiniium Oscilloscopes available from Agilent Technologies, having a business address of 395 Page Mill Road, Palo Alto, Calif. 94304, in a delayed sweep mode, the horizontal sweep speed and horizontal position controls change how the waveform is displayed in the delayed sweep window. The sweep speed changes the amount of magnification, while the position changes the part of the waveform in the main sweep window that is displayed in the delayed sweep window. See "User's Quick Start Guide" for Infiniium Oscilloscopes, available from Agilent Technologies as Publication number 54810-97045, January 2000, p. 3–14.

SUMMARY OF THE INVENTION

In accordance with a preferred embodiment of the present invention, a signal analyzer has a display with two regions. In a first region there is displayed a first waveform representing a signal. The first waveform is shown in two dimensions. One dimension represents signal amplitude and one dimension represents signal frequency. In a second region is displayed a second waveform. The second waveform represents a subset of data points of the first waveform. The second waveform also is shown in two dimensions. One dimension represents signal amplitude and one dimension represents signal frequency.

In a preferred embodiment, a box is displayed in the first region. A left edge of the box represents a start point for the second waveform. A right edge of the box represents a stop point for the second waveform. A top edge of the box represents an upper amplitude limit for the second waveform. A bottom edge of the box represents a lower amplitude limit for the second waveform. In response to a user varying any edge of the box, the second waveform displayed in the second region is correspondingly varied.

A control panel includes four controls. A first control is used to position the left edge of the box. A second control is used to position the right edge of the box. A third control is used to position the top edge of the box. A fourth control is used to position the bottom edge of the box. In one embodiment of the present invention, the four controls are multi-mode so that in a waveform mode the four controls are used to adjust parameters of the first waveform displayed in the first region. The modes are selected with back-lit push buttons. For example, the signal analyzer is a spectrum analyzer. Alternatively, the signal analyzer can be a multi-wavelength meter or any device that analyzes signals and displays the amplitude verses frequency.

The present invention allows a user to observe both a wide and narrow span spectral view simultaneously. The present invention also allows a user to easily select the desired signal from the wide span view to analyze in the narrow span view. The selection technique is much faster and straight-forward than previous select techniques available in spectrum analyzers. Additionally, more information is provided to the user.

DESCRIPTION OF THE PREFERRED EMBODIMENT

Figure 1:
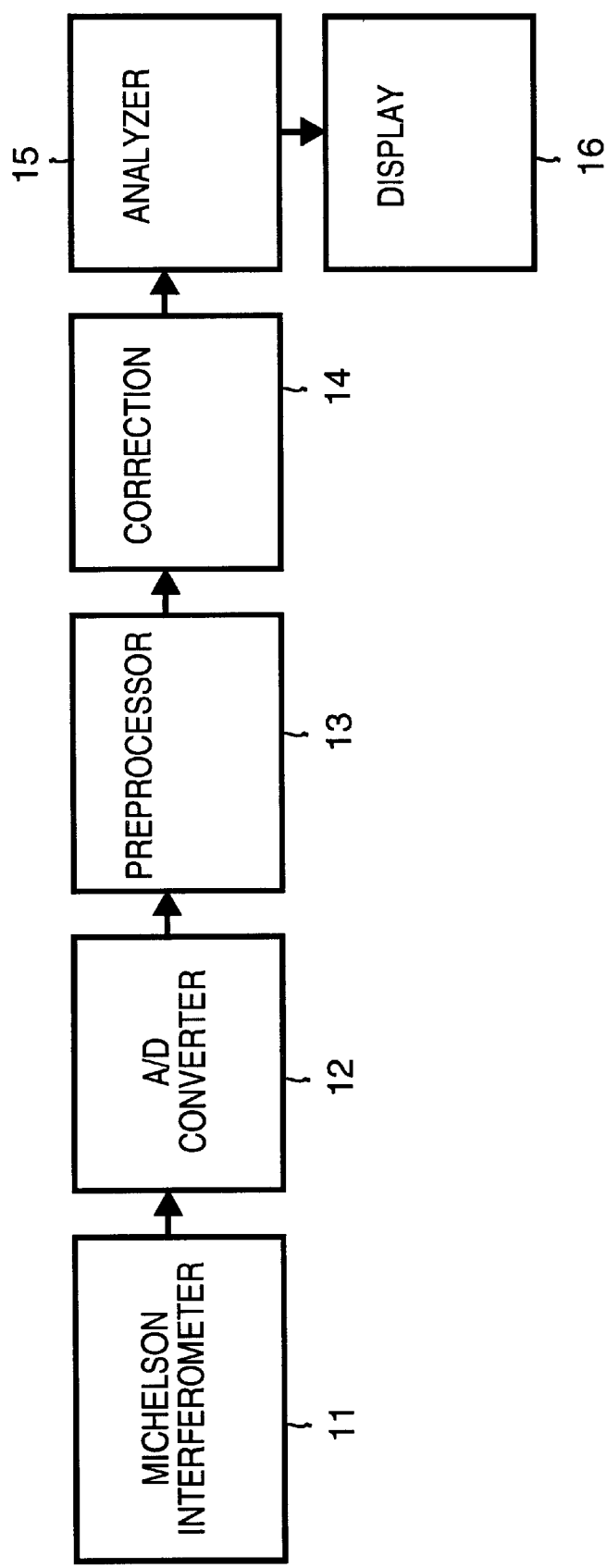
FIG. 1 is a simplified block diagram that illustrates operation of a multi-wavelength meter.

FIG. 1 is a simplified block diagram that illustrates operation of a signal analyzer, for example a multi-wavelength meter used to analyze multiple optical signals. A Michelson interferometer 11 includes a receive diode which generates analog signals forwarded to an analog-to-digital (A/D) converter 12. A preprocessor 13 receives the analog data into a buffer. For example, the buffer is a memory that contains 256K words of data. The data is in the time domain. Preprocessor uses a Fast Fourier Transform (FFT) to generate data in the frequency domain. For example, a memory is used to store 128 K double words, each double word containing a value in complex (r+ji) format. After performing an Aberdization function and a magnitude function, the resulting data is passed to a correction block 14.

Correction block 14 uses a correction table to in order to generate 128K corrected double/real elements. From these elements are derived an input array to analyzer block 15. From the input array, analyzer block 15 finds data for each channel, and stores the data for the channels in a channel repository. The channels are shown by a display 16, as part of a graphical user interface (GUI).

Figure 2:
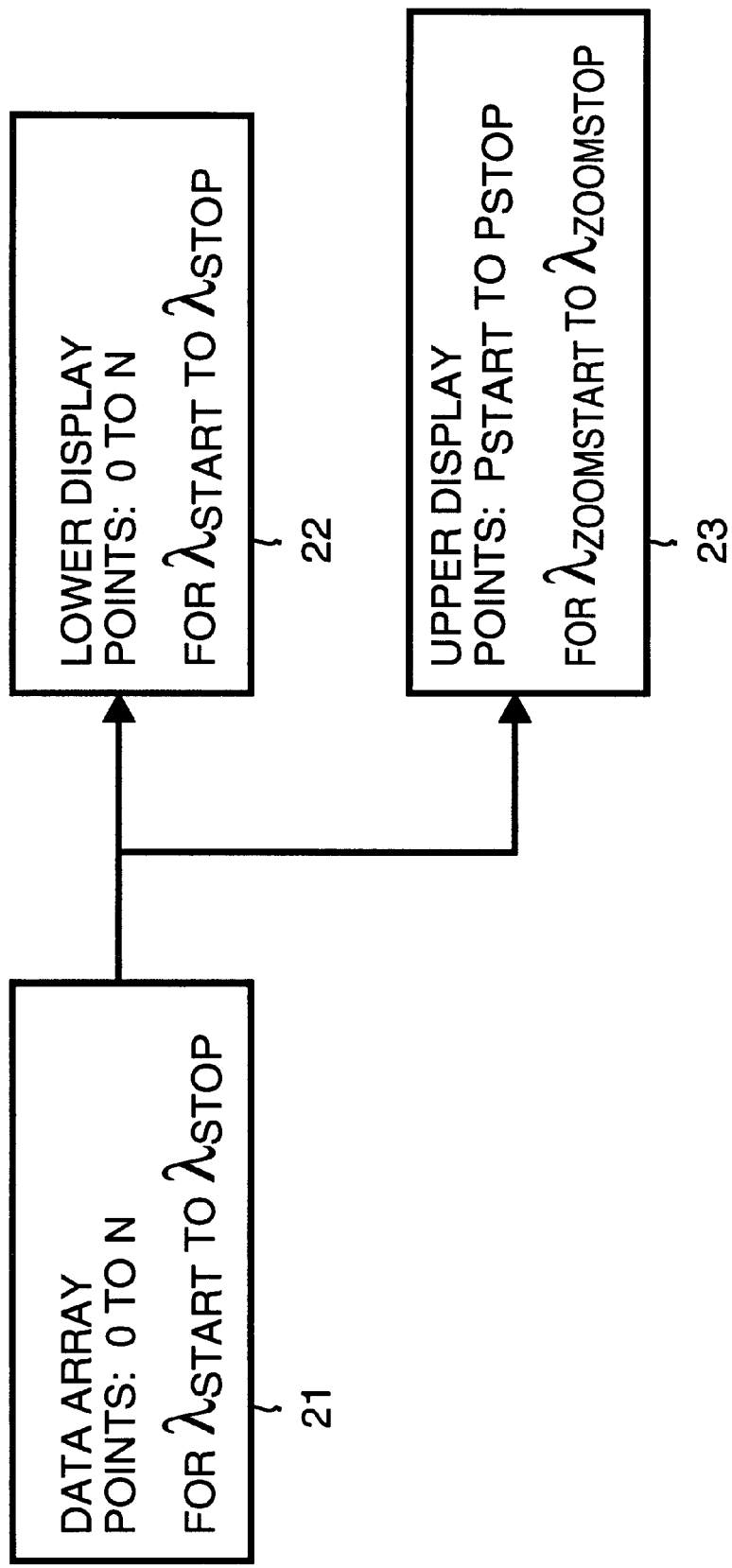
FIG. 2 is a block diagram illustrating implementation of a zoom feature in a spectrum analyzer in accordance with a preferred embodiment of the present invention.

Display 16 displays a signal in an amplitude versus frequency format. FIG. 2 shows a data path within analyzer block 15 used to generate two display signals. In response to user selection, a data array 21 selected for display includes n+1 data points (data array display points 0 to n). These points extend from the display signal start point ($\lambda_{start}$) selected by the user to the display signal stop point ($\lambda_{stop}$) selected by the user.

In one display region, a displayed signal displays all n+1 data points. For example, in a lower display 22, data array display points 0 to n are displayed, extending from the display signal start point ($\lambda_{start}$) to the display signal stop point ($\lambda_{stop}$).

In another display region, a displayed signal displays only a subset of the data points. For example, in an upper display 23 data array display points $P_{start}$ to $P_{stop}$ are displayed. The data points $P_{start}$ and $P_{stop}$ are based on a user selection of a zoom signal start point ($\lambda_{zoom\ start}$) and a zoom signal stop point ($\lambda_{zoom\ stop}$). For example, $P_{start}$ is derived from the zoom signal start point ($\lambda_{zoom\ start}$), the display signal start point ($\lambda_{start}$) and the display signal stop point ($\lambda_{stop}$) utilizing Equation 1 below:

$$P_{START} = \frac{\lambda_{ZOOMSTART} - \lambda_{START}}{\lambda_{STOP} - \lambda_{START}} \times N \qquad \text{Equation 1}$$

Likewise, $P_{stop}$ is derived from the zoom signal stop point ($\lambda_{zoom\ stop}$) the display signal start point ($\lambda_{start}$) and the display signal stop point ($\lambda_{stop}$) utilizing Equation 2 below:

$$P_{STOP} = \frac{\lambda_{ZOOMSTOP} - \lambda_{START}}{\lambda_{STOP} - \lambda_{START}} \times N \qquad \text{Equation 2}$$

Figure 3:
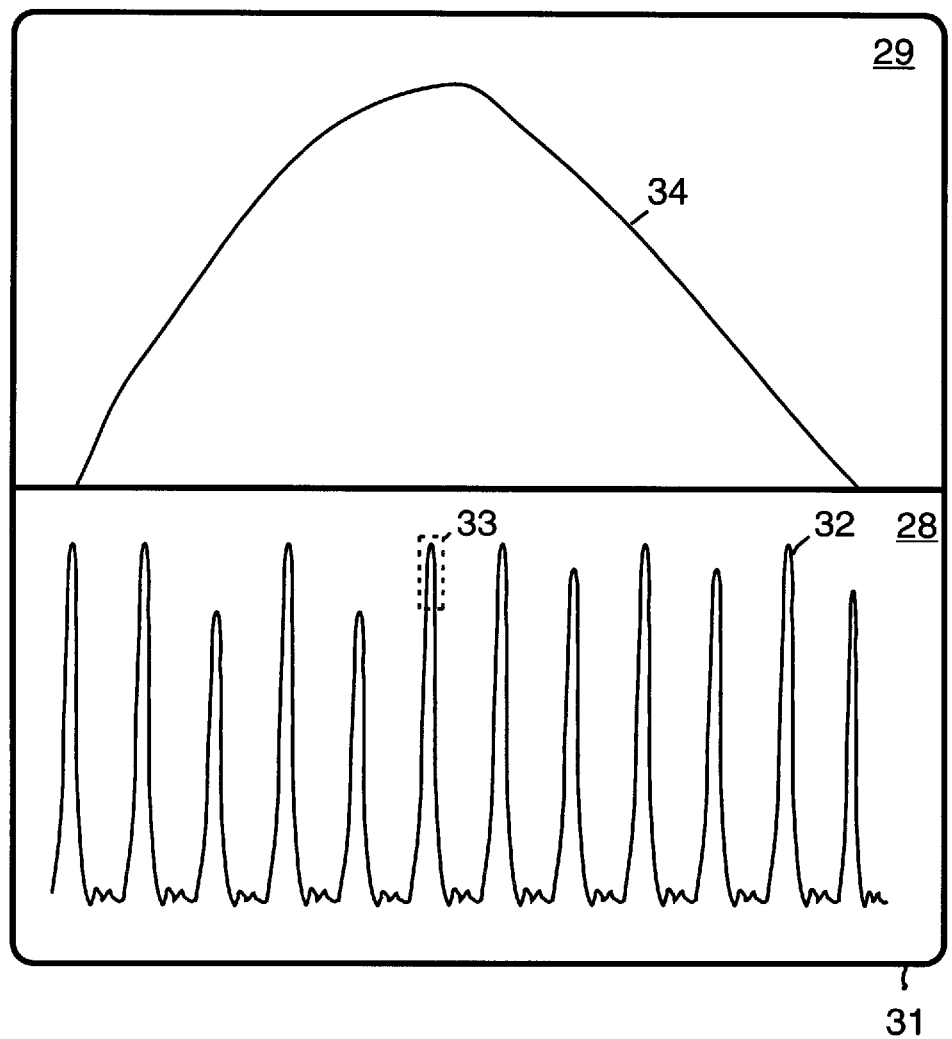
FIG. 3 shows a simplified display screen illustrating use of a zoom feature in a spectrum analyzer in accordance with a preferred embodiment of the present invention.
Figure 3:
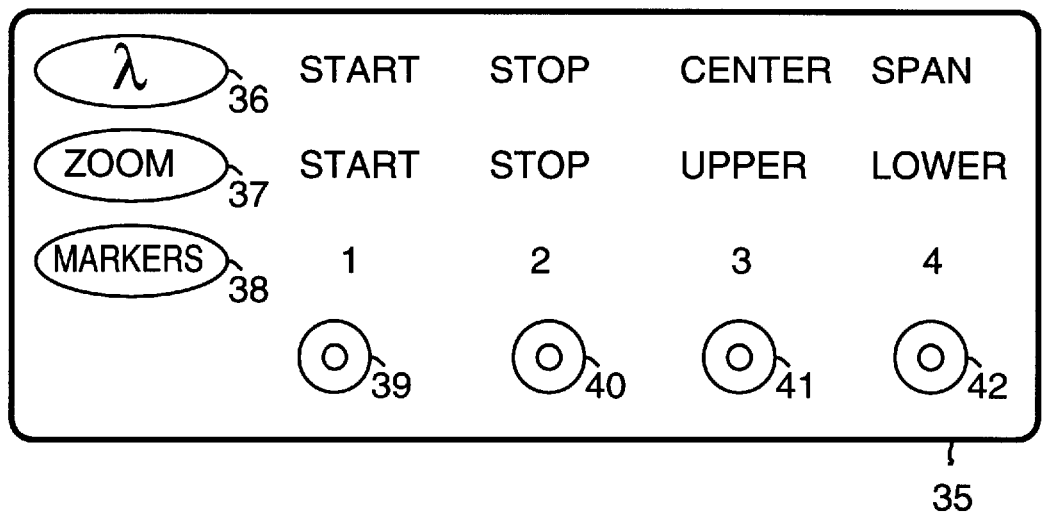

FIG. 3 is a simplified display screen 31 showing use of a zoom feature in a spectrum analyzer in accordance with a preferred embodiment of the present invention. The display screen is broken into two graticule displays, one above the other. In alternative embodiments of the invention, the two graticule displays could be side by side or in some other arrangement. A lower graticule display 28 displays a waveform 32 in the frequency versus amplitude domain as a wide span. When the "zoom" feature is enabled, an upper graticule display 29 displays a waveform 34 in the frequency versus amplitude domain as a narrower span (which is a subset of the wide span view). In alternative embodiments waveform 34 could be displayed in a lower graticule display or in a side graticule display.

When the "zoom" feature is enabled, a box 33 is drawn in lower graticule display 28. Each side of the box corresponds to a graticule edge for upper graticule display 29. For example, the right side of box 33 in lower graticule display 28 corresponds to the stop frequency of upper graticule display 29. And so on.

In a preferred embodiment four knobs are available for setting the respective positions of each side of box 33. The display of box 33 may be turned on and off, as well as the "zoom" graticule display 29.

The four knobs, knob 39, knob 40, knob 41 and knob 42, are multi-purpose, or modal in nature. Three possible modes are shown in FIG. 3. In a "zoom" mode, knob 39 controls the left edge of box 33 which represents the zoom signal start point ($\lambda_{zoom\ start}$) displayed in upper graticule display 29. In the "zoom" mode, knob 40 controls the right edge of box 33 which represents the zoom signal stop point ($\lambda_{zoom\ stop}$) displayed in upper graticule display 29. In the "zoom" mode, knob 41 controls the top edge of box 33 which represents the upper amplitude limit displayed in upper graticule display 29. In the "zoom" mode, knob 42 controls the bottom edge of box 33 which represents the lower amplitude limit displayed in upper graticule display 29.

In a "wavelength" mode, knob 39 controls the wavelength signal start point (λstart) of signal 32 displayed in lower graticule display 28. In the "wavelength" mode, knob 40 controls the wavelength signal stop point (λstop) of signal 32 displayed in lower graticule display 28. In the "wavelength" mode, knob 41 controls the centering of signal 32 displayed in lower graticule display 28. In the "wavelength" mode, knob 42 controls the span of signal 32 displayed in lower graticule display 28.

Knobs 39, 40, 41 and 42 can also be used to individually position four markers (each marker being controlled by a dedicated knob) when in a "marker" mode. Modes are selected with back-lit push buttons. Knob functions active are shown back-lit through a translucent panel label. For example selection of a wavelength push button 36 places display screen 31 in "wavelength mode" and the row of words "START STOP CENTER SPAN" are backlit. Selection of a zoom push button 37 places display screen 31 in "zoom mode" and the row of words "START STOP UPPER LOWER" are backlit. Selection of a markers push button 38 places display screen 31 in "marker mode" and the row of numbers "1 2 3 4" are backlit. While in FIG. 3, the user controls are shown as knobs, other types of controls (e.g., movable dials, digital switches, touch screen adjusters, etc.) can be used. Alternatively, a mouse or other pointing device can be used to change the dimensions of box 33.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

I claim:

1. A display for a signal analyzer, the display comprising:
   a first region in which is displayed a first waveform representing a signal, the first waveform being shown in two dimensions, one dimension representing signal amplitude and one dimension representing signal frequency;
   a second region in which is displayed a second waveform, the second waveform representing a subset of data points of the first waveform, the second waveform also being shown in two dimensions, one dimension representing signal amplitude and one dimension representing signal frequency, wherein a box is displayed in the first region, a left edge of the box representing a start frequency for the second waveform, a right edge of the box representing a stop frequency for the second waveform, a top edge of the box representing an upper amplitude limit for the second waveform and a bottom edge of the box representing a lower amplitude limit for the second waveform;
   means for, in response to a user varying any edge of the box, correspondingly varying the second waveform displayed in the second region; and,
   a control panel, including four controls, a first control being used to position the left edge of the box, a second control being used to position the right edge of the box, a third control being used to position the top edge of the box, a fourth control being used to position the bottom edge of the box, wherein the four controls are multimode so that in a waveform mode the four controls are used to adjust parameters of the first waveform displayed in the first region.

2. A display as in claim 1 wherein modes are selected with back lit push buttons.

3. A display as in claim 1 wherein the signal analyzer is a spectrum analyzer.

4. A signal analyzer, comprising:
   a display, the display comprising:
      a first region in which is displayed a first waveform representing a signal, the first waveform being shown in two dimensions, one dimension representing signal amplitude and one dimension representing signal frequency, and
      a second region in which is displayed a second waveform, the second waveform representing a subset of data points of the first waveform, the second waveform also being shown in two dimensions, one dimension representing signal amplitude and one dimension representing signal frequency, wherein a box is displayed in the first region, a left edge of the box representing a start frequency for the second waveform, a right edge of the box representing a stop frequency for the second waveform, a top edge of the box representing an upper amplitude limit for the second waveform and a bottom edge of the box representing a lower amplitude limit for the second waveform;
   means for, in response to a user varying any edge of the box, correspondingly varying the second waveform displayed in the second region; and,
   a control panel, including four controls, a first control being used to position the left edge of the box, a second control being used to position the right edge of the box, a third control being used to position the top edge of the box, a fourth control being used to position the bottom edge of the box, wherein the four controls are multimode so that in a waveform mode the four controls are used to adjust parameters of the first waveform displayed in the first region.

5. A signal analyzer as in claim 4 wherein modes are selected with back-lit push buttons.

6. A signal analyzer as in claim 4 wherein the signal analyzer is a spectrum analyzer.

7. A method for displaying a signal in a signal analyzer, comprising the following steps:
   (a) displaying, in a first region of a display, a first waveform representing the signal, the first waveform being shown in two dimensions, one dimension representing signal amplitude and one dimension representing signal frequency;
   (b) displaying, in a second region of the display, a second waveform, the second waveform representing a subset of data points of the first waveform, the second waveform also being shown in two dimensions, one dimension representing signal amplitude and one dimension representing signal frequency;
   (c) displaying a box in the first region, a left edge of the box representing a start frequency for the second waveform, a right edge of the box representing a stop frequency for the second waveform, a top edge of the box representing an upper amplitude limit for the second waveform and a bottom edge of the box representing a lower amplitude limit for the second waveform; and,
   (d) in response to a user using a control panel to vary any edge of the box, correspondingly varying the second waveform displayed in the second region in response to a user varying any edge of the box, correspondingly varying the second waveform displayed in the second region, wherein, the control panel includes four controls, a first control being used to position the left edge of the box, a second control being used to position the right edge of the box, a third control being used to position the top edge of the box, a fourth control being used to position the bottom edge of the box, wherein the four controls are multimode so that in a waveform mode the four controls are used to adjust parameters of the first waveform displayed in the first region.

* * * * *